United States Patent [19]
Cole et al.

[11] Patent Number: 5,903,162
[45] Date of Patent: May 11, 1999

[54] PROBE ADAPTER FOR ELECTRONIC DEVICES

[75] Inventors: Paul A. Cole; Emory J. Harry, both of Aloha; Michael A. Wright, Portland, all of Oreg.

[73] Assignee: Tektronix, Inc., Wilsonville, Oreg.

[21] Appl. No.: 08/949,853

[22] Filed: Oct. 14, 1997

Related U.S. Application Data

[60] Continuation of application No. 08/674,310, Jul. 1, 1996, abandoned, which is a division of application No. 08/390,459, Feb. 16, 1995, Pat. No. 5,548,223, which is a continuation of application No. 07/954,618, Sep. 29, 1992, abandoned.

[51] Int. Cl.⁶ .................................................. G01R 1/073
[52] U.S. Cl. .......................................... 324/754; 324/758
[58] Field of Search .................................. 324/754, 758, 324/755, 765, 73.1

[56] References Cited

U.S. PATENT DOCUMENTS

| | | | |
|---|---|---|---|
| 2,023,947 | 12/1935 | Auble | 324/73.1 |
| 2,578,288 | 12/1951 | Cook | 324/73.1 |
| 3,405,361 | 10/1968 | Kattner et al. | 324/759 |
| 3,596,228 | 7/1971 | Reed et al. | 339/59 |
| 4,065,717 | 12/1977 | Kattner et al. | 324/158 |
| 4,636,722 | 1/1987 | Ardezzone | 324/158 |
| 4,922,192 | 5/1990 | Gross et al. | 324/158 |
| 4,963,821 | 10/1990 | Janko et al. | 324/158 |
| 5,087,877 | 2/1992 | Frentz et al. | 324/158 |
| 5,203,075 | 4/1993 | Angulas et al. | 29/830 |
| 5,526,275 | 6/1996 | Enomoto | 364/488 |

FOREIGN PATENT DOCUMENTS

| | | | |
|---|---|---|---|
| 5830256 | 2/1983 | Japan | G01R 5/14 |

*Primary Examiner*—Ernest F. Karlsen
*Attorney, Agent, or Firm*—William K. Bucher

[57] ABSTRACT

An adapter for a measurement test instrument electrical probe has a flexible dielectric substrate with electrically conductive runs thereon. One end of the conductive runs has first electrical contacts with a pitch geometry corresponding to the pitch geormetry of electrical contacts of an electronic device that is electically connected to a substrate via the electrical contacts of the device. The other end of the conductive runs has second electrical contacts that have a pitch geometry compatible with the electrical probe of the measurement test instrument.

6 Claims, 3 Drawing Sheets

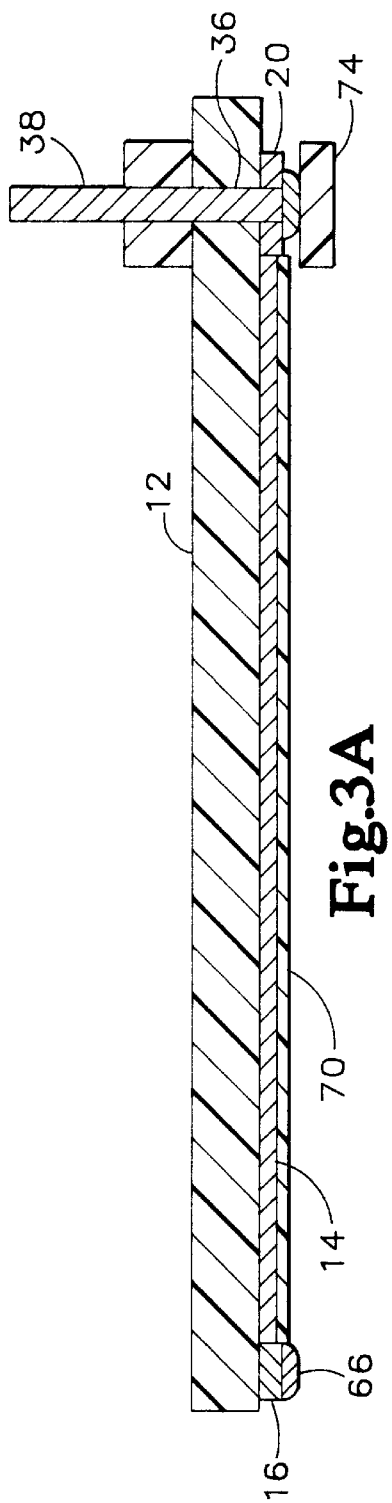
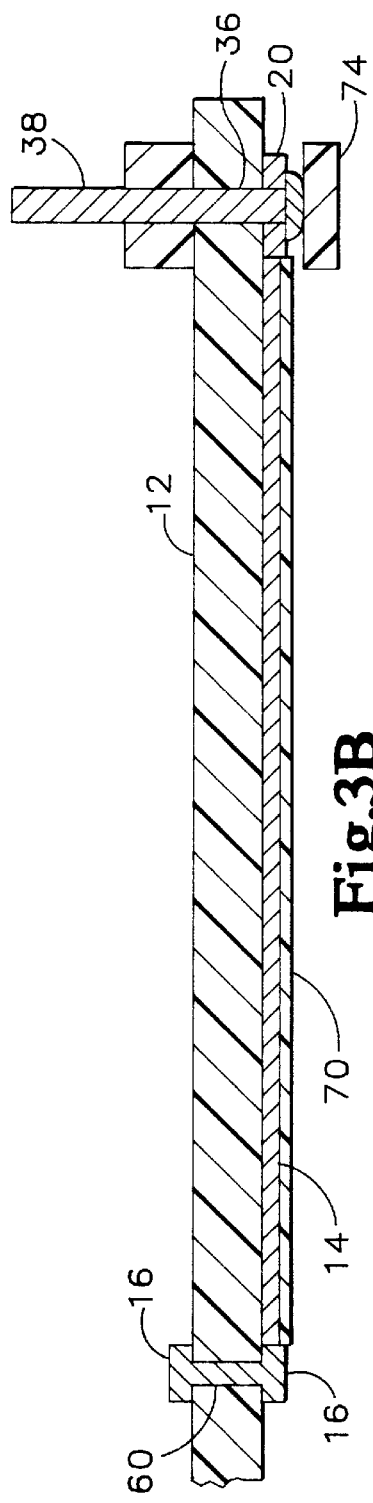
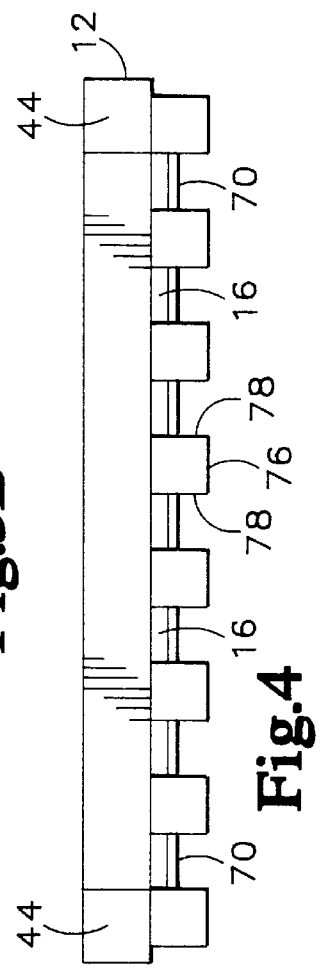

PROBE ADAPTER FOR ELECTRONIC DEVICES

This is a continuation application of application Ser. No. 08/674,310, filed Jul. 1, 1996, now abandoned, which is a divisional patent applicaton of application Ser. No. 08/390,459, filed Feb. 16, 1995, now U.S. Pat. No. 5,548,223, which is a continuation of application Ser. No. 07/954,618, filed Sep. 29, 1992, now abandoned.

BACKGROUND OF THE INVENTION

The present invention relates to adapters for measurement test instrument electrical probes and more specifically to a high density, fine pitch, flexible probe adapter for electronic devices, such as surface mounted integrated circuit devices.

Surface mounted (SMT) integrated circuit devices are fast becoming the dominant type of IC packaging in the electronics industry. These devices come in a wide variety of package configurations and lead pitch geometries. For example, IC packages may be square or rectangular with electrical contact or lead counts from 44 to 232 or higher. A variety of electrical contact or lead types are also being used. Quad flat pack IC's use Gull wing leads or J-leads. Both type of leads extend from the perimeter of the IC package with the former type of leads bending down and outward from the package while the later bend down and fold under the package in a J-shape. The leads are soldered to electrical contact pads formed on a circuit board. Pin-grid-array (PGA) and land-grid-array (LGA) devices have electrical contacts formed in a matrix on the bottom surface of the IC package. The PGA devices have lead wires extending downward that engage a corresponding matrix of through holes in the circuit board. The leads are soldered in the through holes to make the electrical connections. LGA devices have a matrix of raised electical contacts formed on the bottom surface of the IC, which are soldered to a corresponding matrix of electrical contact pads on the circuit board.

Probing PGA devices with standard measurement instrument electrical probes, such as passive and active oscilloscope probes or the like, requires access to the reverse side of the circuit board on which the PGA device is soldered. LGA device additional contact pads have to be formed on the circuit board and electrically connected to the matrix of contact pads underneath the LGA device to allow probing of the device.

The small pitch geometries of the quad flat pack SMT devices makes these devices very difficult to probe using oscilloscope or logic analyzer probes. The pitch geometries or lead spacing between leads varies on these device. The most commonly used lead spacings for quad flat packs are 0.65 mm, 0.8 mm, 1 mm, and 0.025 inches. Work is progressing on even smaller pitch geometries in the range of 0.010 inch lead spacing. Using oscilloscope probes on these types of IC packages can cause the shorting of adjacent leads of the device. To overcome this problem, adapters have been developed that provide a transition from the small pitch geometries of the SMT device to a pitch geometry that is compatible with oscilloscope and logic analyzer probes. An example of one such adapter is described in U.S. patent application Ser. No. 07/530,141, filed May 24, 1990 and titled "An Adapt and Test Fixture for an Integrated Circuit Device Package." The adapter has a housing with a top and vertically depending sidewalls that forms an internal cavity for receiving the IC package. Electrically conductive elements are disposed within the sidewalls with one end of the elements making electrical connections with the leads of the IC package. The other end of the elements form electrically conductive pads on top of the adapter. A variety of test heads may be connected to the adapter that have test points with a pitch spacing that allows easy probing with oscilloscope probes and logic analyzer probes.

Current adapters require expensive dies and tooling for each type of package configuration and pitch geometry. Further, positioning accuracy of the adapters, which must fit over the SMT device, is adversely affected by the SMT plastic package itself. The tolerances for the package dimensions are greater than the tolerances for the lead spacings themselves. This can lead to misalignment of the adapter on the device. The only accurate tolerances on SMT devices are the lead pitches themselves.

As SMT devices get larger, heat build-up in the devices becomes a problem. Varous types of heat sink have been mounted on these devices to overcome this problem. However, once a heat sink is secured to a device, a new adapter has to be designed and built to take the heat sink into account. Designing and tooling-up dies for new adapters for each type of device with a heat sink becomes prohibitively expensive.

What is needed is an in-expensive probe adapter for multiple types of IC devices that provides connectivity to standard measurement test equipment electrical probes.

SUMMARY OF THE INVENTION

Accordingly, the present invention is an adapter for coupling an electrical test probe of a measurement test instrument to electrical contacts of an electronic device where the pitch geometry of the contacts is defined by the separation between contacts and the contacts are connected to a substrate. The adapter has a flexible dielectric substrate with electrically conductive runs formed thereon. First electrical contacts are formed on one end of the runs having a pitch geometry corresponding to the pitch geometry of the contacts of the electronic device. Second electrical contacts are formed on the other end of the runs having a pitch geometry compatible with the electrical probe of the measurement test instrument.

In a further aspect of the present invention, means are provided for aligning the first electrical contacts of the adapter with the contacts of the electronic device. The first electrical contacts may be disposed adjacent to one of opposing edge surfaces of the dielectric substrate with tabs extending from this edge surface for engaging the contacts of a surface mounted integrated circuit device. Preferably, the tabs engage the outer most contacts of the integrated circuit device providing precise alignment of the first electrical contacts with the contacts of the device.

In a another aspect of the present invention, the adapter is interposed between conductive pads of a circuit board and the contacts of the electronic device. The flexible dielectric substrate has opposing top and bottom surfaces with the first electrical contacts being formed an both surfaces. The opposing contacts are electrically connected together with the contact on one surface electrically connected to contacts of the surface mounted integrated circuit device and the other contact electrically connected to conductive pads on the circuit board. The first electrical contacts may be in the form of a M×N matrix corresponding to a M×N matrix of conductive pads on the circuit board and a M×N matrix of contacts on the electronic device where M and N are greater than 1. The electrical connection between opposing first electrical contacts may be by a plated through hole. Apertures are formed in the dielectric substrate for aligning the adapter with conductive pads on the circuit board.

In still another aspect of the present inventions resistive elements are disposed on the electrically conductive runs as pan of a fifty ohm coaxial transmission line input to a fifty ohm measurement test instrument.

In still a further aspect of the present invention means are disposed between each of the first electrical contacts of the adapter for electrically isolating the contacts from each other. The objects, advantages and novel features of the present invention are apparent from the following detailed description when read in conjunction with appended claims and attached drawings.

BRIEF DESCRIPTION OF THE DRAWINGS

FIG. 3A is a cross-sectional view along line A–A' of the adapter in FIG. 1 according to the present invention.

FIG. 4 is an end view toward the edge surface 18 of the adapter FIG. 1 according to the present invention.

DETAILED DESCRIPTION OF THE PREFERRED EMBODIMENT

Figure 1:
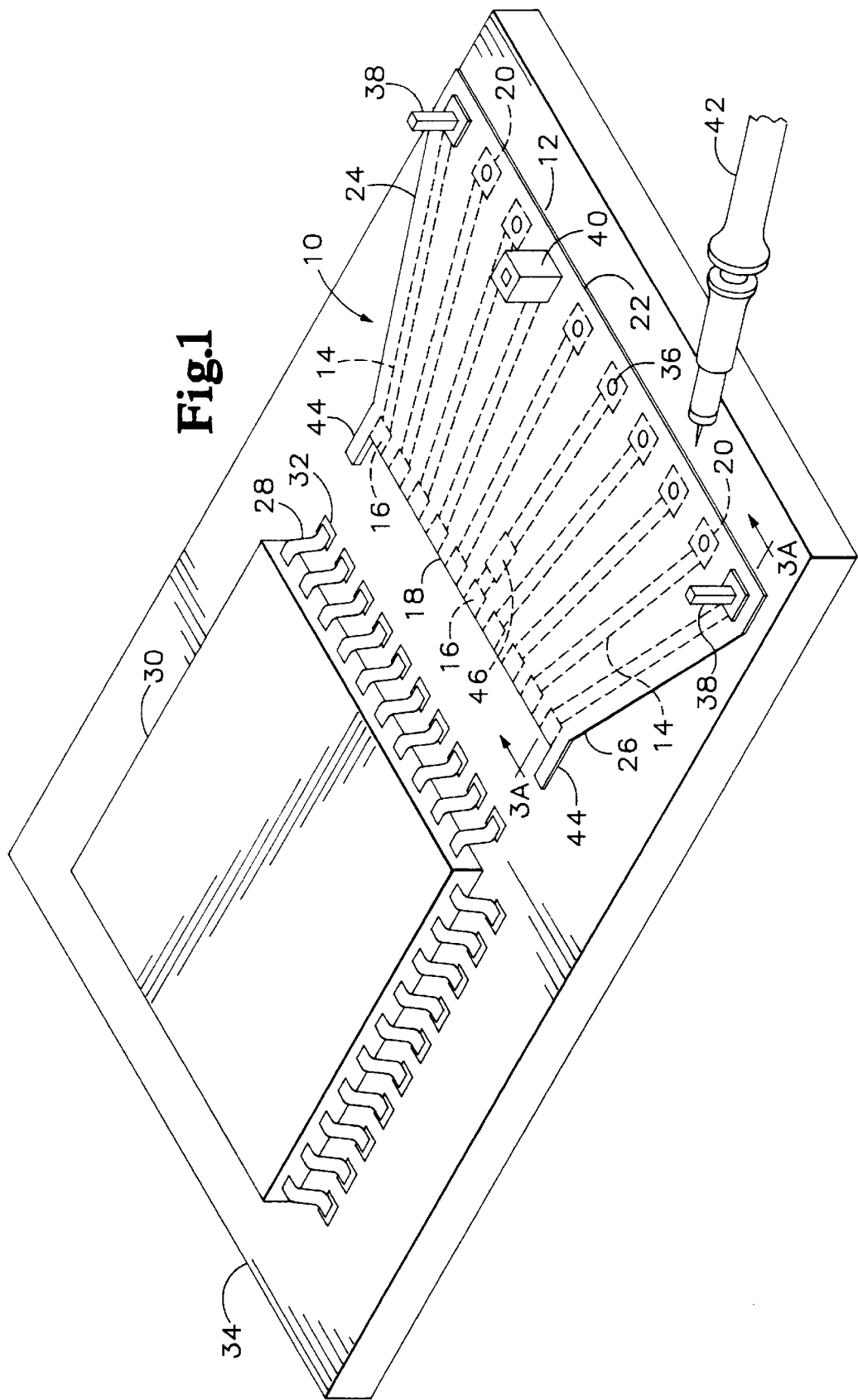
FIG. 1 is a perspective view of the adapter according to the present invention.

Referring to FIG. 1, there is shown an adapter 10 for an electrical test probe according to the present invention. The adapter 10 has a flexible dielectric substrate 12 with electrically conductive runs 14 formed thereon. Electrical contacts 16 are formed on one end of the conductive runs 14 adjacent to a first edge surface 18 of the dielectric substrate 12. Electrical contacts 20 are also formed on the other end of runs 14 adjacent to a second edge surface 22 of the substrate 12 opposite the first edge surface 18. The side surfaces 24 and 26 of the substrate angle outward from the first edge surface 18 to the second edge surface 22 forming a substantially trapezoidal shaped adapter 10.

The adapter 10 is designed to interface with electrical contacts or leas 28 of electronic devices 30, such as surface mounted integrated circuit devices (SMT), pin-grid-array (PGA) devices, and hybrid devices. The electronic device 30 in FIG. 1 is shown as a quad flat pack SMT device having gull-wing electrical contacts 28 extending from the perimeter of the device. The contacts 28 bend down and outward to engage conductive pads 32 on a substrate or circuit board 34. Another type of SMT device has J-leads where the leads extend from the perimeter of the device and bend back under the device. Land-grid-arrays (LGA) are a third type of SMT devices where a matrix of raised contacts are formed on the bottom surface of the device, which are soldered to a corresponding matrix of conductive pads on the circuit board. PGA devices are similar to LGA devices in that a matrix of contacts are formed on the bottom of the device. However, the PGA have wire lead electrical contacts instead of raised contacts and use through hole technology to mount the device on the circuit board instead of surface mount technology. The wire contacts engage plated through holes in the circuit board and are soldered into place.

The electrical contacts 16 have a pitch geometry corresponding to the pitch geometry of the electrical contacts 28 on the electronic device 30. For U.S. produced gull-winged quad-flat-pack devices, the pitch geometry is generally 0.025 inches between lead centers. The pitch geometry for electrical contacts 20 is generally 50 mils or greater. Contacts 20 may have a plated through holes 36 formed therein for receiving industry standard square pins 38 or square pin connectors 40. Both type of parts may be ganged together with injected molded plastic and are generally ganged together on 100 mil centers. The square pins 38 or connectors 40 are electrically connected to contacts 20 by soldering. The pitch geometry of contracts 20 are compatible with hand-held measurement test instrument probes 42, such as oscilloscope or logic analyzer probes. That is the spacing between adjacent contacts 20 is sufficient to allow probing of the contacts without serious risk of shorting adjacent contacts together. This is not possible with contacts having a pitch geometry of 0.025 inches.

Tabs 44 may be added to the adapter to accurately align the electrical contacts 16 with the leads 28 of the electronic device 30. The tabs 44 extend from the first edge surface 18 of the dielectric substrate 12 and engage the outside edges of the outermost leads 28 of the device 30. Industry requirements provide for very accurate lead spacing which allows the use of the inexpensively formed tabs 44 to accurately position the electrical contacts 16 to the contacts 28 of the electronic device 30.

In a 50 ohm test environment where the input to the measurement test instrument is 50 ohms, the adapter may be modified to include a film resistors, such as representively shown by 46, formed on the conductive runs 14. The resistor 46 is one leg of a voltage divider network that includes the input resistance of the measurement test instrument. For a 10 times $Z_o$ probe, the resistor 46 has a nominal value of 450 ohms. The geometry of the conductive runs 14 are formed for 50 ohm characteristic impedances and the contacts 20 are modified to connect to a 50 ohm coaxial cable.

Figure 2:
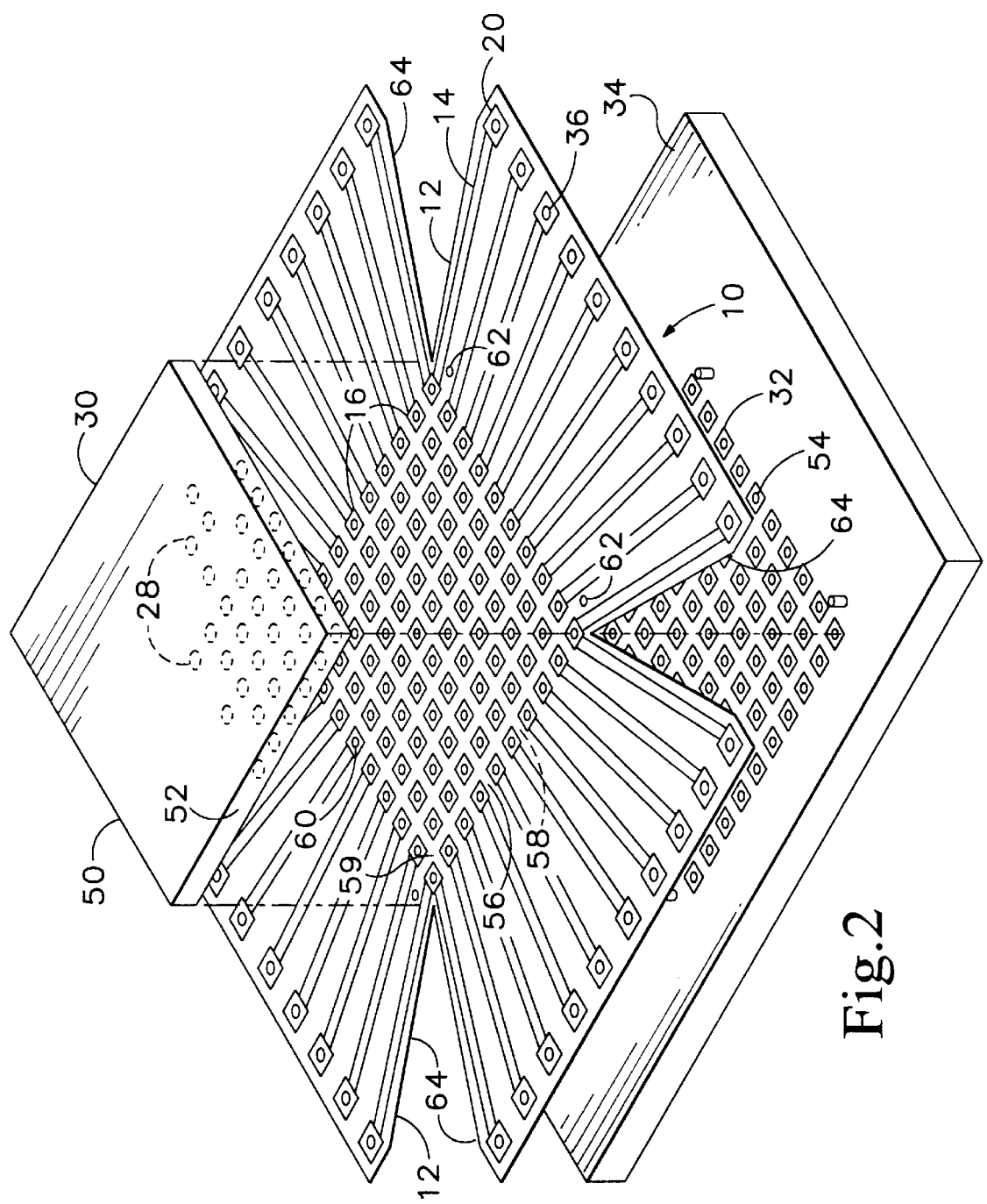
FIG. 2 is a perspective view of an alternative embodiment of the adapter according to the present invention.

Referring to FIG. 2, there is shown an alternative embodiment of the adapter 10. The adapter 10 is interposed between the electronic device 30 and the substrate or circuit board 34. The electronic device has opposing top and bottom surface, respectively numbered 50 and 52, with electrical contacts 28 formed in a M×N matrix on the bottom surface 52. For Land-Grid-Arrays (LGA), the contacts 28 are raised electrically conductive bumps and in Pin-Grid-Arrays (PGA) the contacts are wire leads extending down from the bottom surface. In either case, the M×N matrix of contacts 28 are electrically connected to a corresponding M×N matrix of contacts 32 on the substrate or circuit board 34. For PGA devices, the contacts 32 have plated through hole 54 formed therein for receiving the wire leads of the PGA device.

The electrical contacts 16 of the adapter 10 are formed on both top and bottom surfaces, respectively numbered 56 and 58, of a central portion 59 of substrate 12 in a M×M matrix where M and N are greater than 1 corresponding to the pitch geometry of the M×N matrix of electrical contacts 28 of the device 30. Electrically conductive vias or plated through holes 60 electrically connect the respective contacts 16 on the top surface 56 with the corresponding contants 28 of the bottom surface 58. Apertures 62 are formed in the dielectric substrate 12 to accurately position the adapter 10 on the substrate or circuit board 34 prior to the placement of the electronic device 30.

FIG. 2 representatively shows the conductive runs 14 connecting electrical contacts 16 and 20 together on one of the trapezoidal wings 64 of the adapter 12. The same pattern of conductive runs 14 and contacts 16 and 20 are formed on the other trapezoidal wings 64.

The adapter 10 of the present invention is intended for use in engineering for prototyping circuits and in a test environment for troubleshooting devices already mounted on circuit boards. The adapter 10 may be connected to the contacts 28 of the electronic device 30 either before or after the device is soldered to the circuit board 34. When used with devices where the contacts 28 are exposed on the circuit board, the adapter is positioned on the contacts 28 and secured in place by soldering or using an electically conductive adhesive 66. When used with devices where the contacts are under the device, the adapter 10 is interposed between the circuit board 34 and the electronic device 30. The adapter 10 is positioned on the circuit board 32 in alignment with the conductive pads 32 on the circuit board. The contracts 28 of the electronic device are connected to the adapter via pick placement using an automated parts placement apparatus. Reflow soldering is used to secure the adapter 10 to the circuit board 34 and to the contacts 28 of the electronic device 30. Once the adapter 10 is electically connected and secured to the contacts 28 of the electronic device 30, a measurement test instrument electrical probe is connected to any one of the electrical contacts 20 of the adapter.

FIG. 3B is a cross-sectional view along line B–B' of the adapter of FIG. 2 according to the present invention. The substrate 12 may be made of any flexible dielectric material, such as polyamide or the like. The conductive runs 14 and the electrical contacts 16 and 20 are formed on the substrate 12 using industry standard etching techniques. In FIG. 3A, the conductive runs and electrical contacts 16 and 20 are formed on the same surface of the substrate 12. The conductive runs are covered by an insulating member 70 to electrically isolate the runs. Square pin 38, shown in injected molded plastic, has one end passing through the through hole 36 in the substrate 12 and soldered to the electrical contact 20. Another insulating member 74 may be used to electrically isolate the solder connections. FIG. 3B is similar to FIG. 3A with the exception of the electrically conductive vias or plated through holes 60 being provided in the substrate 12 to electrically connect the electrical contacts 16 on the top 56 and the bottom 58 surfaces of the substrate 12.

FIG. 4 is an end side view of the surface 18 of the adapter 10 showing an alternative embodiment of the invention. To provide additional electrical isolation between the contacts 16 when connected to the contacts 28 of the electronic device, a dielectric material is built-up between the contacts 16. The dielectric material has a top surface 76 with depending sidewalls 78. The top surface is raised above the surface of contacts 16 so that the sidewalls fit between the leads 28 of the electronic device 30.

An adapter has been described for coupling an electrical test probe of a measurement test instrument to electrical contacts of an electronic device where the pitch geometry of the contacts is defined by the separation between contracts and the contacts are connected to a substrate. The adapter has a flexible dielectric substrate with electrically conductive runs formed thereon. First electrical contacts am formed on one end of the runs having a pitch geometry corresponding to the pitch geometry of the contacts of the electronic device. Second electrical contacts are formed on the other end of the runs having a pitch geometry compatible with the electrical probe of the measurement test instrument. These and other aspects of the present invention are set forth in the appended claims.

What is claimed is:

1. An adapter for coupling an electrical test probe of a measurement test instrument to an electronic device having top and bottom surfaces with electrical contacts formed in a M×N matrix on the bottom surface for providing electrical connections to a corresponding M×N matrix of electrical contacts on a circuit board where M and N are greater than one comprising a flexible dielectric substrate having a central portion and at least one extending wing portion with electrically conductive runs formed thereon with one end of the conductive runs having first electrical contacts disposed in the central portion in a M×N matrix where M and N are greater than one, corresponding to the M×N matrix of the electrical contracts on the bottom surface of the electronic device, and the other end of the conductive runs forming second electrical contacts on the wing portion having a pitch geometry compatible with the electrical probe of the measurement test instrument, the first electrical contacts being formed on top and bottom surfaces of the dielectric substrate with means for electrically connecting each first electrical contact on the top surface with a corresponding first electrical contact on the bottom surface of the adapter, and means for aligning the M×N matrix of first electrical contacts on the dielectric substrate with the M×N matrix of electrical contacts on the circuit board.

2. The adapter as recited in claim 1 wherein the means for electrically connecting the electrical contacts on the top surface with corresponding electrical contacts on the bottom surface of the adapter comprise plated through holes formed in the flexible dielectric substrate.

3. The adapter as recited in claim 2 wherein the electronic device is an integrated circuit device having a M×N matrix of electrical leads extending from the bottom surface of the device that pass through the plated through holes in the M×N matrix of first electrical contacts of the adapter into plated through holes formed in the circuit board.

4. The adapter as recited in claim 1 wherein the electronic device is an integrated circuit device having a M×N matrix of raised electrical contacts formed on the bottom surface of the device that contact the M×N matrix of first electrical contacts of the adapter.

5. The adapter as recited in claim 1 wherein the second electrical contacts further comprise electrically conductive pins electrically connected to the second electrical contacts.

6. The adapter as recited in claim 1 wherein the means for aligning the M×N matrix of first electrical contacts on the dielectric substrate with the M×N matrix of electrical contacts on the circuit board comprises apertures formed in the dielectric substrate for engaging alignment pins on the circuit board.

* * * * *